(12) United States Patent
Min et al.

(10) Patent No.: US 7,715,224 B2
(45) Date of Patent: May 11, 2010

(54) MRAM WITH ENHANCED PROGRAMMING MARGIN

(75) Inventors: Tai Min, San Jose, CA (US); Po Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 17 days.

(21) Appl. No.: 11/787,330

(22) Filed: Apr. 16, 2007

(65) Prior Publication Data

US 2008/0253178 A1 Oct. 16, 2008

(51) Int. Cl.
*G11C 11/00* (2006.01)
*G11C 11/14* (2006.01)
*G11C 11/15* (2006.01)

(52) U.S. Cl. .................. 365/158; 365/171; 365/173
(58) Field of Classification Search ............... 365/158, 365/171, 173
See application file for complete search history.

(56) References Cited

U.S. PATENT DOCUMENTS

| | | | |
|---|---|---|---|
| 5,587,943 A * | 12/1996 | Torok et al. ............... 365/158 |
| 6,272,040 B1 | 8/2001 | Salter et al. | |
| 6,335,890 B1 | 1/2002 | Reohr et al. | |
| 6,490,217 B1 | 12/2002 | De Brosse et al. | |
| 6,594,191 B2 | 7/2003 | Lammers et al. | |
| 6,798,690 B1 | 9/2004 | Katti | |
| 6,798,691 B1 | 9/2004 | Ounadjela et al. | |
| 7,020,015 B1 | 3/2006 | Hong et al. | |
| 7,154,798 B2 * | 12/2006 | Lin et al. ............... 365/158 |
| 7,180,769 B2 | 2/2007 | Wang et al. | |
| 7,184,302 B2 | 2/2007 | Yang et al. | |
| 7,345,911 B2 * | 3/2008 | Min et al. ............... 365/158 |

FOREIGN PATENT DOCUMENTS

WO WO 03/050817 A2 6/2003
WO WO 03/075634 A2 9/2003

OTHER PUBLICATIONS

"Switching field variation in patterned submicron magnetic film elements", by Youfeng Zheng et al., J. Appl., Phys. 81 (8), Apr. 15, 1997, pp. 5471-5473.
"MRAM with novel shaped cell using synthetic anti-ferromagnetic free layer", by Y.K. Ha et al., 2004 IEEE, 2004 Symposium on VLSI Tech., Digest of Tech. Papers, pp. 24-25.
Co-pending U.S. Appl. No. 11/264,583, filed Nov. 1, 2005, "Thermally Assisted Integrated MRAM Design and Process for Its Manufacture", assigned to the same assignee as the present invention.
08392002.5-2210, Jul. 16, 2008, MagIC Technologies Inc.

* cited by examiner

*Primary Examiner*—Trong Phan
(74) *Attorney, Agent, or Firm*—Saile Ackerman LLC; Stephen B. Ackerman (57) ABSTRACT

An MRAM that is not subject to accidental writing of half-selected memory elements is described, together with a method for its manufacture. The key features of this MRAM are a C-shaped memory element used in conjunction with a segmented bit line architecture.

28 Claims, 7 Drawing Sheets

MRAM WITH ENHANCED PROGRAMMING MARGIN

FIELD OF THE INVENTION

The invention relates to the general field of Magnetic Random Access Memories (MRAM) with particular reference to widening the operating margin and shaping the memory element.

BACKGROUND OF THE INVENTION

Magnetic tunneling junctions (MTJs) and GMR/Spin Valve (SV), with two ferromagnetic layers separated by a non-magnetic layer (a tunneling dielectric layer for MTJs and a transitional metal for GMR/SV), have been widely studied for use as a memory element (such as in MRAM). Usually one of the ferromagnetic layers has a fixed magnetization direction (the pinned layer) while the other layer is free to switch its magnetization direction (the free layer).

Figure 1A:
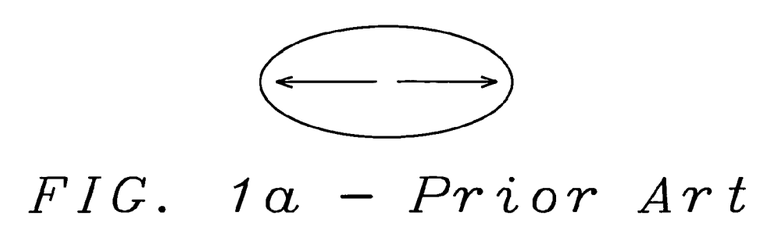
FIGS. 1a and 1b show the basic parts of a memory elements and how an easy axis results from shape anisotropy of said memory element.
Figure 1B:
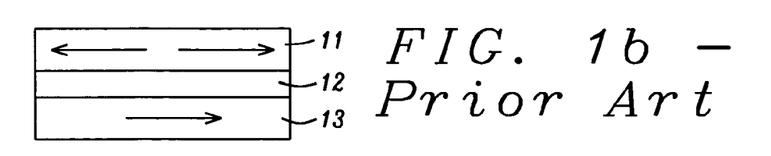

For MRAM applications, the magnetic stack (MTJ or GMR/SV) is usually shaped so as to exhibit shape anisotropy. Shape anisotropy is present whenever the shape of the storage element deviates from a circle, e.g. an ellipse. In its quiescent state, the free layer magnetization lies along the long axis of the cell either parallel or anti-parallel to the direction of magnetization of the pinned layer (see arrows in FIG. 1a). This long axis is referred to as the easy axis (x), the direction perpendicular to it being the hard axis (y). A cross sectional view of this for the case of a MTJ element is shown in FIG. 1b, with element 11 representing the free layer, element 12 the dielectric tunneling layer, and element 13 the pinned layer.

Figure 2:
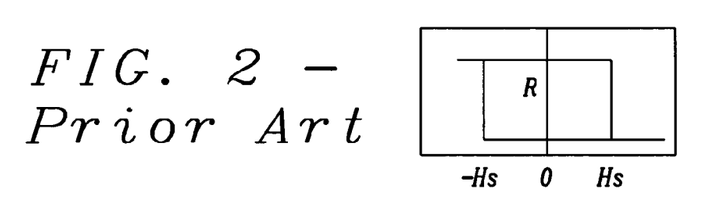
FIG. 2 shows the resistance of an MTJ memory element as a function of external field.

Digital information is thus stored according to the direction of magnetization of the free layer. FIG. 2 shows the resistance R of such a MTJ element as a function of external field Hs along the orientation of the pinned layer magnetization. When the field is off, the two states with minimum and maximum resistances correspond to the free layer magnetization being parallel and anti-parallel to the pinned layer magnetization respectively. The field required to switch between the two states (Hs) is determined by the shape anisotropy energy of the element. When an additional external field is simultaneously applied in the hard axis direction at the same time, the value of Hs is reduced, becoming zero when the hard axis field reaches a particular value (Hy_sat).

Figure 3A:
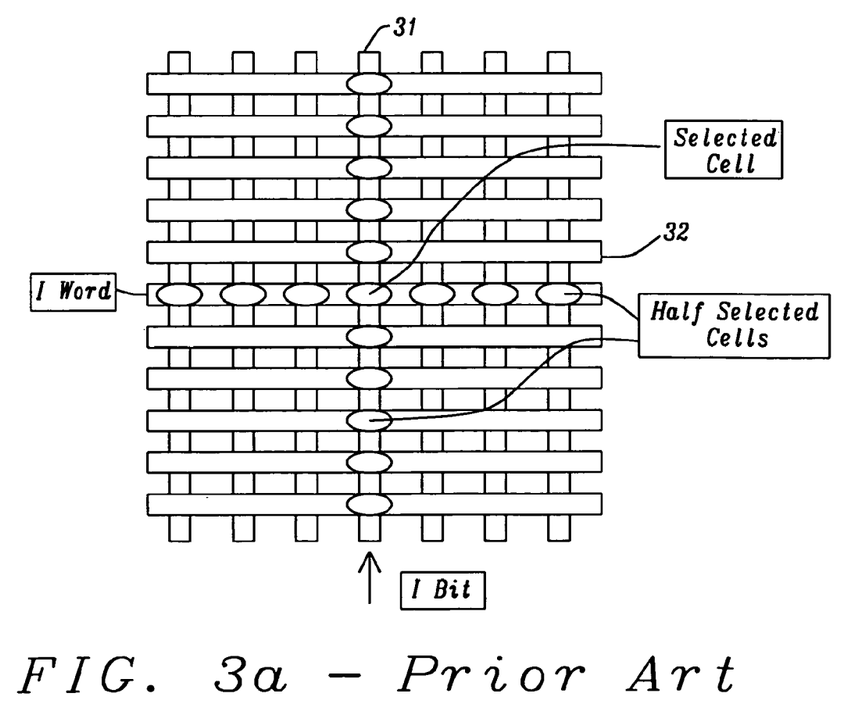
FIG. 3a shows how the external fields used to program an MRAM cell are provided by two seta of current lines.

In MRAM applications, both the external fields used to program the MRAM cell are provided by current lines. As shown in FIG. 3a, bit line 31 provides the easy axis field while word line 32 provides the hard axis field. To program a cell, both bit and word line currents are applied. The combination of these two fields overcomes the shape anisotropy to set the magnetization of the selected cell into the desired direction. This cell is referred to as a selected cell. Due to process/film property variations, there will be some variation in the shape anisotropy so the combined value of bit/word line fields needed to write each selected cell also varies. To reliably write all selected memory cells, the bitline and wordline current (shown in the figure as $I_{bit}$ and $I_{word}$, respectively) have to have been chosen to be able to write the cell will highest shape anisotropy.

However, while writing the selected cell, many other cells that lie under the bit line or the word line (but not both) that are not intended to be programmed experience the field of either the bit or word line current. Although this field is smaller than the combined field experienced by the selected cell, these cells can still be accidentally programmed, thereby causing an error. These cells are referred to as half-select cells. The probability of a half-selected cell being accidentally written depends on the value of the applied bitline or wordline current, Hs and Hy_Sat, the higher the bit/word line current and the smaller the Hs or Hy_sat, the easier it is for a half-select error to occur. Again, there are variations in Hs and Hy_sat. So the values of both the bit and word currents must be carefully chosen—too low and the selected cell cannot be reliably programmed, too high and they will cause errors on half-selected cells.

The window for programming an MRAM is determined by 3 boundaries: the combined field from both bit and word lines needed to reliably write the selected cells, the distance between the bit line field and the smallest Hs at which $I_{word}=0$, and the distance between the word line field and the smallest Hy_sat. It is crucial to have a window large enough for the reliable programming of selected cells yet small enough to not cause half-select errors. The window can be enlarged by increasing the shape anisotropy value but this approach demands higher bit and word currents which is not desirable for high density applications.

Figure 3B:
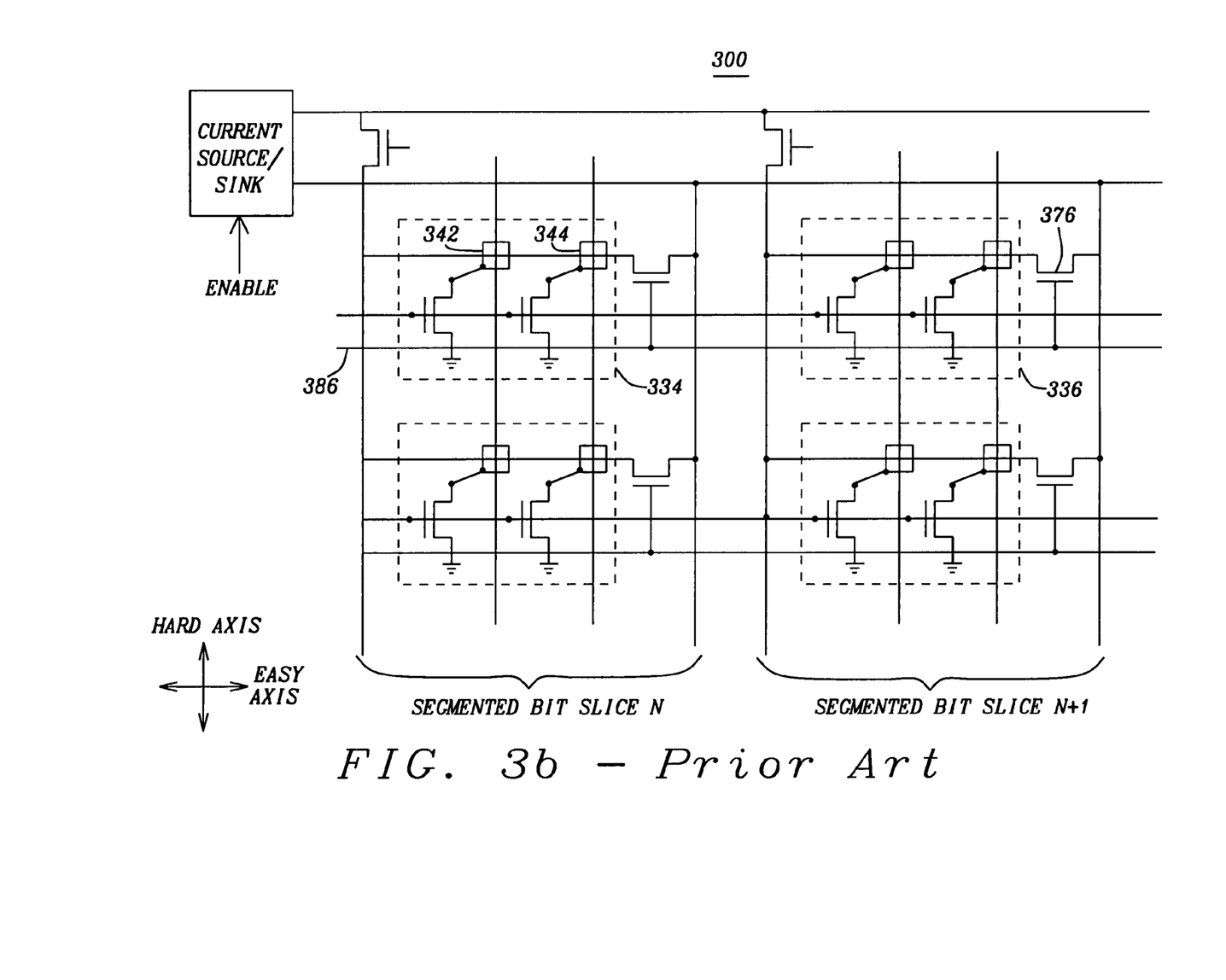
FIG. 3b illustrates how the memory elements may be segmented into groups whereby not all memory elements that lie on the same bit or word line as a selected element have to be half selected.
Figure 4:
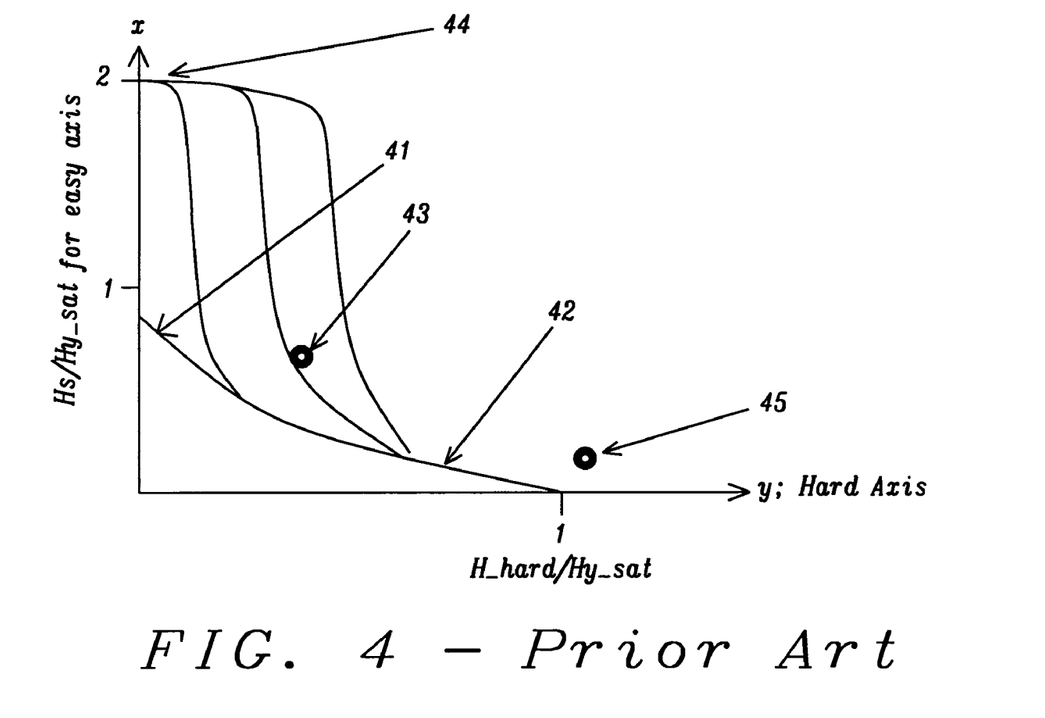
FIG. 4 shows the operating points for memory elements of the prior art and the present invention.

An alternative approach (U.S. Pat. Nos. 6,798,690B1 and 6,798,691 B1) is to increase Hs at $I_{word}=0$ while maintaining Hs at $I_{word}$, by confining the free layer magnetization configuration to the "C-state". The method to achieve this is by patterning the MTJ cell into certain curved shapes. The "C-state" will have much higher Hs, as described by Ref.[1]. As shown in FIG. 4, Hs for a small hard axis field, is significantly greater in the C-switching mode 44 than in the conventional rotational switching mode. In the high hard axis field region, the switching behavior of the C-state returns to the normal rotational mode. Thus, for C-state cells, the distance between the bit line field and the smallest Hs at $I_{word}=0$ is significantly increased. Note that FIG. 3b also shows a pair of lines (current source/sink) shared by both segments. Also shown in FIG. 3b is the enable gate that activates these lines as needed.

This approach will significantly reduce the probability of half-select errors under the bit line. The programming window now is mainly defined by the writing field needed to write the selected cell and the distance between the word line field and the smallest Hy_sat. The MRAM write operating points, 41 and 42, for these two prior art approaches are set near the inflection point 43 of the curves, as indicated in FIG. 4. The problem with this operating point is that the inflection point at which the switching mode changes from C-state to normal rotational switching, has a very wide distribution, as indicated by the dashed curves in FIG. 4. This causes significantly increased variation in the field needed to write the selected cells, which greatly reduces the operating window.

Another approach to handling half-select issues along bit and word line is the segmented write architecture (U.S. Pat. Nos. 6,335,890 and 6,490,217). This is illustrated in FIG. 3b. It provides a technique for overcoming the limitations of conventional write selection schemes. By way of example only, a write operation directed to a specific segmented group, e.g., 334 in FIG. 3b will now be described:

Select line memory array 300 directs the application of a destabilizing hard axis magnetic field to a subset of memory cells, namely, those memory cells associated with segmented group 334. All memory elements 342, 344 within the selected segmented group 334 are written simultaneously. An unselected segmented group (e.g., 336), sharing a common write word line 386 with segmented group 334, does not receive a half-select field along its hard axis even when the group select switch (e.g., 376) corresponding to the unselected segmented group 336 is enabled. This is primarily due to the fact that only one segmented bit slice among adjacent segmented bit slices, e.g., segmented bit slices N and N+1, can receive a destabilizing write current at any given time.

Consequently, the magnitude of the hard axis field can be increased with no danger of disturbing the state of an unselected memory cell. Since all memory cells experiencing a hard axis field will, by definition, be written simultaneously, there are no half-selected memory cells along the word dimension using the segment write architecture.

The operating point 45 for a selected memory cell in the segmented write architecture is also shown in FIG. 4. Seen there is a plot of the required switching field as a function of the hard axis field (both normalized by being shown as fractions of the saturation field Hy_sat). On this part of the operating curve, the magnitude of the easy axis field (used to write the selected cell) can be substantially decreased. The write margin between selected and half-selected cells is significantly increased. Moreover, because a large easy axis field is not required by the select line architecture of the invention, the bit line current required to write the memory cells can be significantly reduced, thereby reducing the overall write current required by the memory array 300.

Figure 5A:
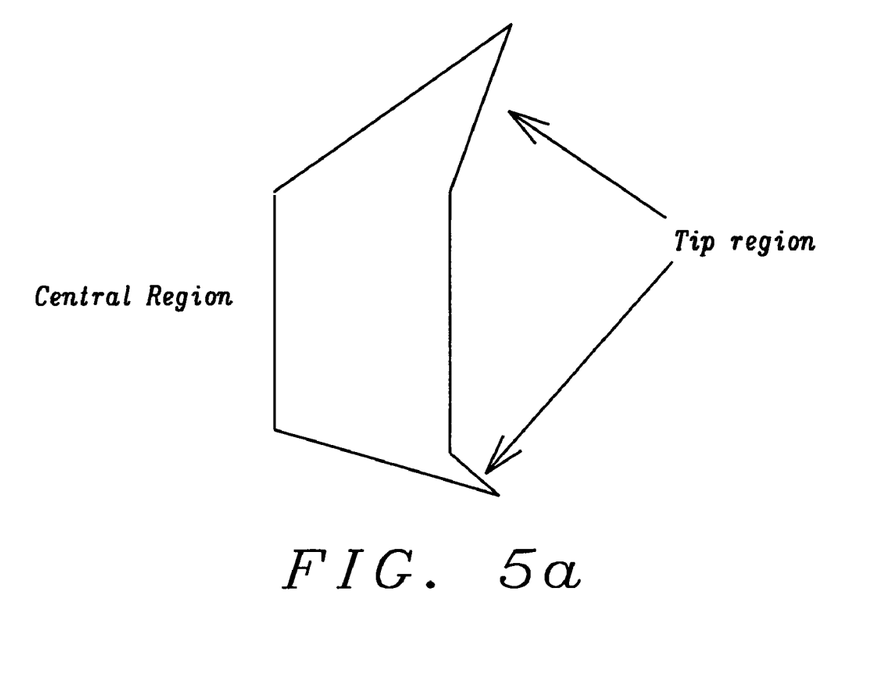
FIG. 5a shows an example of a C-shaped memory element.

An example of a C-shape is shown by FIG. 5a. The free layer magnetizations at the two tip regions have been arranged to be at an angle to its central region, tilted toward its hard axis direction with the magnetization components perpendicular to the hard axis located opposite to each other. The tip regions serve as the nucleation sites for inducing the C switching. The angle of a tip region with respect to the central region can be varied from 10 to greater than 90 degree.

In addition to the references cited above, the following references of interest were also found:

U.S. Pat. No. 6,272,040 (Salter et al) shows a method to program more than one coupled memory cell using a medium current level. U.S. Pat. No. 6,594,191 (Lammers et al) teaches that only memory cells in a selected segment get a hard axis high field. U.S. Pat. No. 7,020,015 (Hong et al) shows shape anisotropy with edge or tip portions in the "pacman" shape.

SUMMARY OF THE INVENTION

It has been an object of at least one embodiment of the present invention to provide an MRAM that is not subject to accidental writing of half-selected memory elements.

Another object of at least one embodiment of the present invention has been to move the operating point for said MRAM into a more stable position.

Still another object of at least one embodiment of the present invention has been to provide a method for manufacturing said MRAM.

These objects have been achieved by shaping the memory elements of said MRAM into shapes that facilitate magnetization forming a C-configuration, with the central region magnetization parallel along the magnetization of the pinned layer and two tip regions with magnetizations at an angle to the pinned layer magnetization direction, while at the same time organizing the memory elements in a segmented bit line architecture. The result of combining both approaches in a single system is that the operating point (for programming memory elements) is moved to a relatively high word line field region where the switching mode is rotational. At this operating point a huge programming window is achieved since the variation of field needed to program the selected cells is smallest; no half-select cells along the word line; and the field needed from the bit line is significantly reduced together with a significant increase of Hs from the C-state switching so the half-select problem along the bit line is greatly reduced.

A detailed description of the shape requirements that must be met by the memory elements is provided together with a large number of examples of possible shapes.

The method for manufacturing the magnetic random access memory (MRAM) claimed by the present invention begins with the provision of a magnetically pinned layer, a magnetically free layer, and a transition layer located between these pinned and free layers. The free layer of this MRAM cell is then patterned into a memory element whose shape includes a first area, whose magnetization is along the pinned layer, in a first magnetization direction, and a second area that has two opposing tip regions, having second magnetization directions, that are at an angle relative to the above first magnetization direction. The second magnetization direction has a component that is perpendicular to the first magnetization direction, the first and second directions of magnetization differing by between about 5 and 90 degrees.

The write word and bit lines are organized as a set of segmented write line groups, each segmented group including a set of memory cells operatively coupled to a corresponding segmented write word line conductor. The memory cells on one segmented write word line are simultaneously programmed by a set of bit lines operatively coupled to the magnetic memory cells for selectively writing states into the memory cells.

In combination with the shaped memory elements, the programming range gets widened as the MRAM is enabled to operate in a region where MRAM cell programming variation is reduced.

As examples of the memory element shapes referred to above we describe the following specific shapes in greater detail:

alpha, beta, gamma, delta, concave hexagon, epsilon, zeta, eta, theta, iota, kappa, lambda, crescent, sausage, and boomerang:

The alpha shape comprises three sides of a rectangle concavely connected by a symmetrical curve.

The beta shape comprises three sides of a rectangle that are concavely connected through an asymmetrical curve.

The gamma shape comprises a straight-line side, an opposing concave side that is symmetrically disposed relative to the straight line, and a pair of opposing convex sides that connect the concave side to the straight-line side.

The delta shape comprises a straight-line side, an opposing concave side that is asymmetrically disposed relative to the straight line, and a pair of opposing convex sides that connect the concave side to the straight-line side.

The concave hexagon comprises three sides of a rectangle that are concavely connected through three straight lines of approximately equal length.

The epsilon shape comprises a pair of opposing parallel lines having corresponding first and second ends; these first ends are connected through a convex curve and the second ends are connected through a concave curve having a radius that is the same as that of the convex curve.

The zeta shape comprises a pair of opposing parallel lines that have corresponding first and second ends, the first ends being connected through a convex curve and the second ends being connected through a concave curve that has a radius of curvature greater than that of the convex curve.

The eta shape comprises a pair of opposing parallel lines, having corresponding first and second ends, the first ends being connected through a convex curve while the second ends are connected through a concave curve whose radius of curvature is less than that of the convex curve.

The theta shape comprises a pair of symmetrically disposed concentric arcs that subtend less than 180 degrees, these arcs being connected to one another, at corresponding ends, by straight lines.

The iota shape comprises a pair of symmetrically disposed concentric arcs that subtend more than 180 degrees, these arcs being connected to one another, at corresponding ends, by straight lines.

The kappa shape comprises a pair of symmetrically disposed concentric arcs that subtend less than 180 degrees, these arcs being connected to one another at corresponding ends by a straight line that is also the base of a triangular shape having a rounded apex.

The lambda shape comprises a pair of symmetrically disposed concentric arcs that subtend more than 180 degrees, these arcs being connected to one another at corresponding ends by a straight line that is also the base of a triangular shape having a rounded apex.

The crescent, sausage, and boomerang shapes are shaped like the objects after which they are named.

DESCRIPTION OF THE PREFERRED EMBODIMENTS

As discussed earlier, the approach to handling half-select issues along bit and word lines is to combine a segmented write architecture with shaping the MRAM cells to form C-state switching mode. The field operating point for this was shown on FIG. 4. The present invention shows how full advantage of the "C-state" switching mode can be taken by combining it with the segmented write architecture. It is, however, important to choose the optimum C-shape when doing so, as we will discuss below.

Figure 5B:
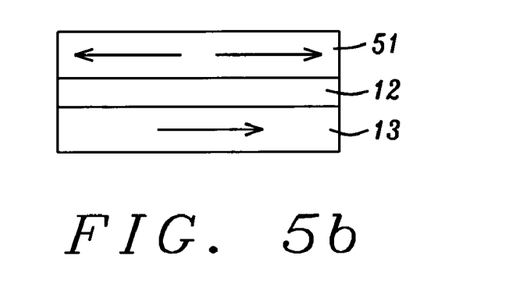
FIG. 5b shows the basic parts of a memory element including the free layer of the invention.
Figure 5C:
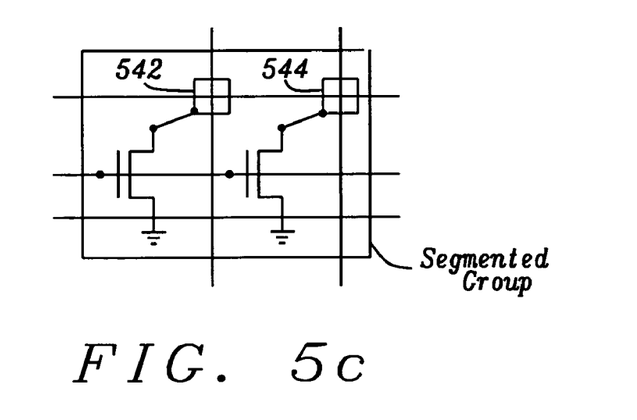
FIG. 5c shows memory elements formed according to the invention within a segmented group of the type illustrated in FIG. 3b.
Figure 6A:
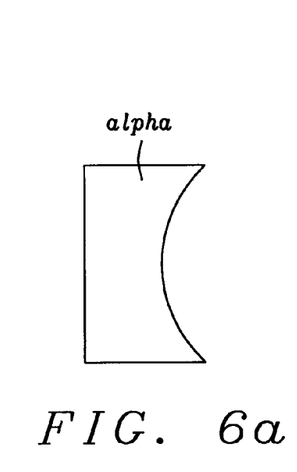
FIGS. 6a through 6e illustrate shapes alpha, beta, gamma, delta, and the concave hexagon, all of which are a suitable shape for a memory element patterned according to the teachings of the invention.

The two aspects of the present invention are: use of shape anisotropy to stabilize the quiescent magnetization in the C-state through obtaining a very high Hs at a low hard axis saturation field (Hy_sat) and eliminating the half-select issue along the word line by utilizing the segmented write architecture. As seen in FIG. 5a, the shapes utilized in the C-state usually have an elongated central region to create an easy axis direction while having two edges bent toward its hard axis direction. These two edges can be symmetric or asymmetric against the other dimension. In FIG. 5b we show how, in cross-section, free layer 51 is similar to free layer 11 that appeared in FIG. 1b. In plan view, however, free layer 51 has one of several possible C-shapes that will be described below. A schematic illustration of inserting the device of FIG. 5b (instantiated as elements 542 and 544) into a segmented architecture, of the type shown in FIG. 3b, can be seen in FIG. 5c. Some examples of shapes that give optimum results when combined with the segmented bit architecture are given below:

FIG. 6a illustrates shape alpha which is made up of three sides of a rectangle that are concavely connected through symmetrical curve 61.

Figure 6B:
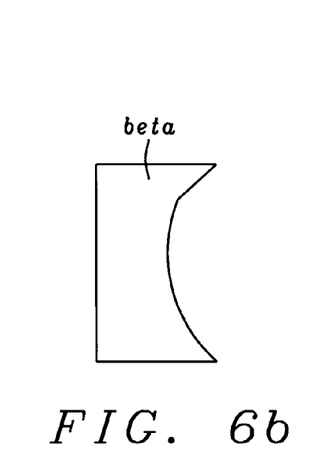

FIG. 6b illustrates shape beta which is made up of three sides of a rectangle that are concavely connected through asymmetrical curve 62. Said asymmetry may be located along any part of curve 62.

Figure 6C:
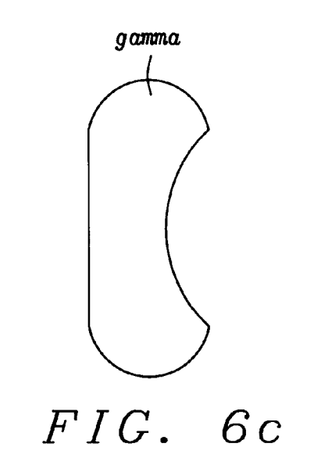

FIG. 6c illustrates shape gamma which is made up of a straight line side, an opposing concave side, symmetrically disposed relative to said straight line, and a pair of opposing convex sides that connect said concave side to said straight line side.

Figure 6D:
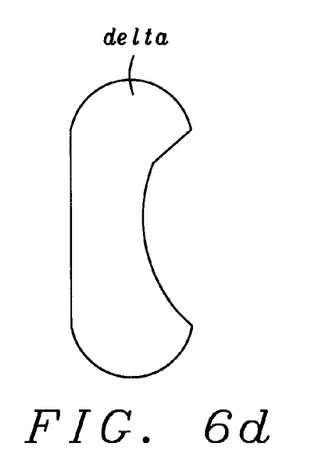

FIG. 6d illustrates shape delta which is made up of a straight line side, an opposing concave side, asymmetrically disposed relative to said straight line, and a pair of opposing convex sides that connect said concave side to said straight line side.

Figure 6E:
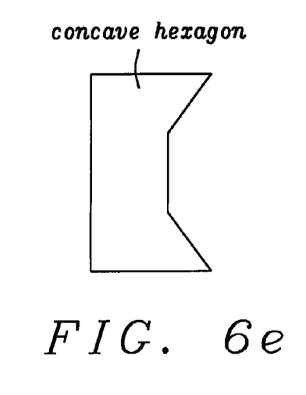

FIG. 6e illustrates a concave hexagon wherein three sides of a rectangle are concavely connected through three straight lines of approximately equal length.

Figure 7A:
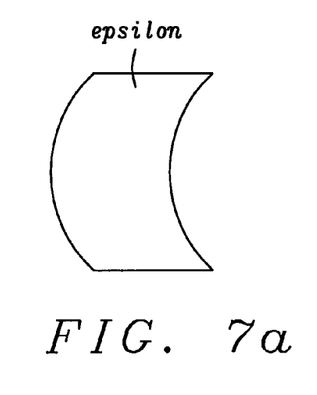
FIGS. 7a through 7c illustrate shapes epsilon, zeta, and eta, all of which are a suitable shape for a memory element patterned according to the teachings of the invention.

FIG. 7a shows shape epsilon which is made up of a pair of opposing parallel lines 711 having corresponding first and second ends in which said first ends are convexly connected through curve 712 and said second ends are concavely connected through curve 713 that has a radius that is the same as that of curve 712.

Figure 7B:
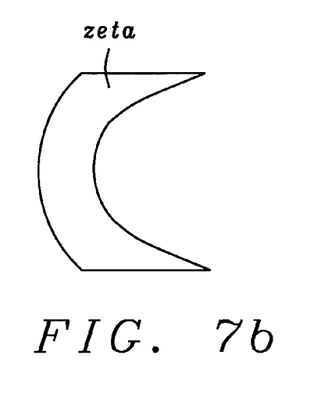

FIG. 7b shows shape zeta which is made up of a pair of opposing parallel lines 721 having corresponding first and second ends in which said first ends are convexly connected through curve 722 and said second ends are concavely connected through curve 723 that has radius of curvature greater than that of curve 722.

Figure 7C:
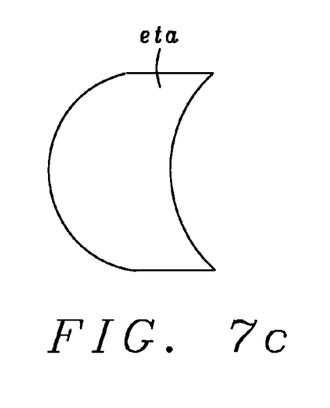

FIG. 7c shows shape eta which is made up of a pair of opposing parallel lines 731 having corresponding first and second ends in which said first ends are convexly connected through curve 732 and said second ends are concavely connected through curve 733 that has a radius of curvature less than that of curve 732.

Figure 8A:
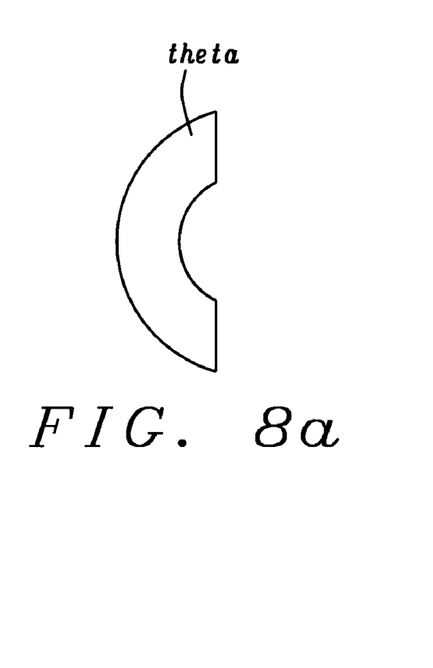
FIGS. 8a through 8d illustrate shapes theta, iota, kappa, and lambda concave hexagon, all of which are a suitable shape for a memory element patterned according to the teachings of the invention.

FIG. 8a shows shape theta which is made up of a pair of symmetrically disposed concentric arcs that subtend less than 180 degrees, said arcs being connected to one another at corresponding ends by straight lines.

Figure 8B:
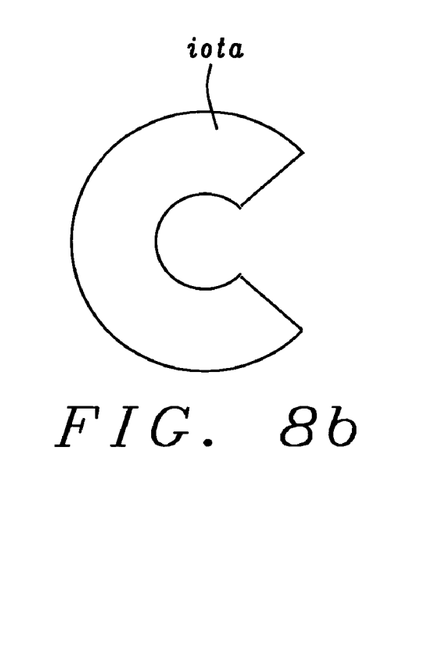

FIG. 8b shows shape iota which is made up of a pair of symmetrically disposed concentric arcs that subtend more than 180 degrees, said arcs being connected to one another at corresponding ends by straight lines.

Figure 8C:
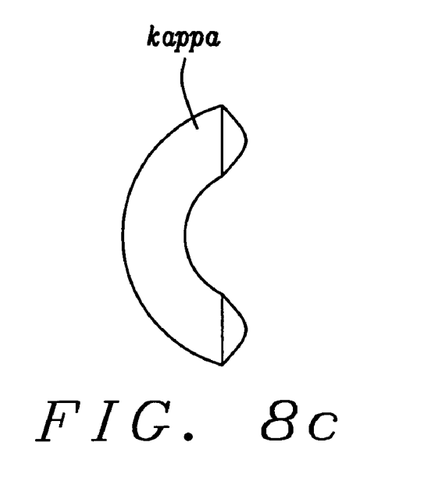

FIG. 8c shows shape kappa which is made up of a pair of symmetrically disposed concentric arcs that subtend less than 180 degrees, each of said arcs being connected to one another at corresponding ends by a straight line that is also the base of a triangular shape having a rounded apex.

Figure 8D:
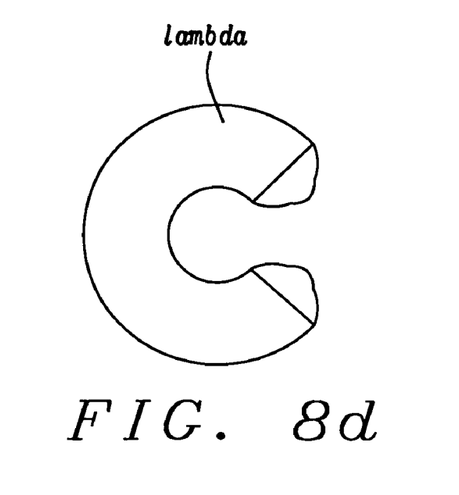

FIG. 8d shows shape lambda which is made up of a pair of symmetrically disposed concentric arcs that subtend more than 180 degrees, each of said arcs being connected to one another at corresponding ends by a straight line that is also the base of a triangular shape having a rounded apex.

FIGS. 9a-9d show several other possible shapes such as the crescent, the sausage, the boomerang, and the packman, respectively.

Figure 9A:
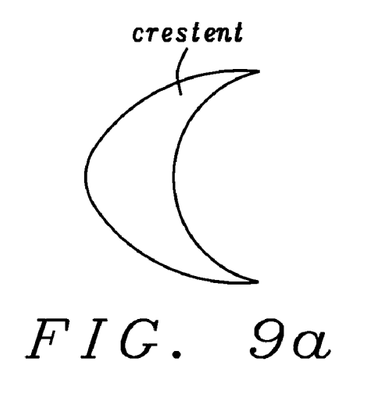
FIGS. 9a through 9d illustrate the crescent, sausage, boomerang, and packman shapes, respectively, all of which are a suitable shape for a memory element patterned according to the teachings of the invention.
Figure 9B:
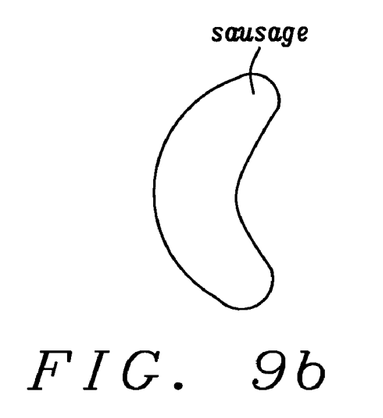
Figure 9C:
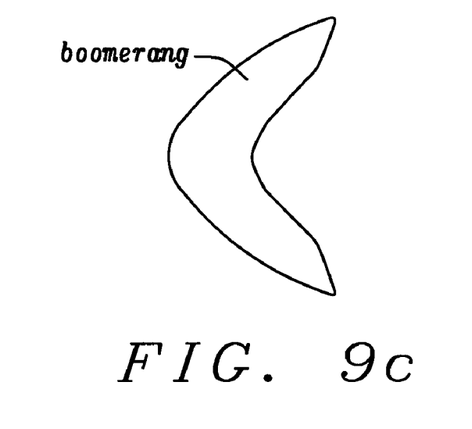
Figure 9D:
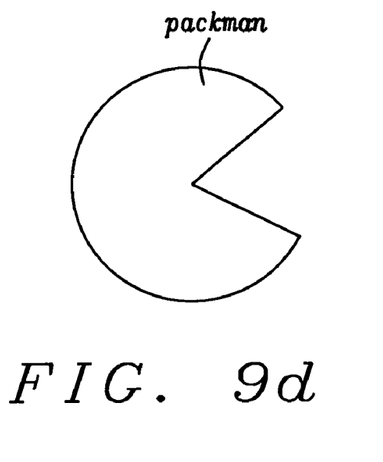
Figure 9E:
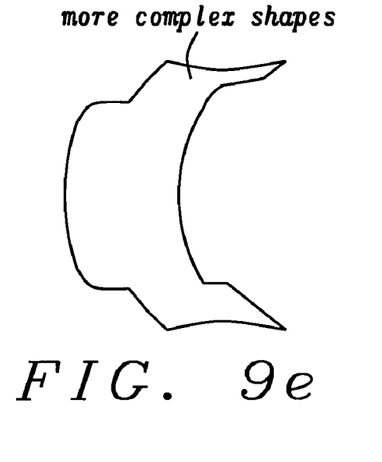
FIG. 9e symbolizes a general class of "more complex" memory element shapes.

FIG. 9e symbolizes the general class of shapes that we will describe as "more complex". In the general case, any such shape would include a first area (central region) which magnetization lies in a first direction that is along the magnetization of pinned layer and second area (two tip regions) which magnetizations have an angle with respect to the magnetization directions of $1^{st}$ area, the magnetizations of those 3 region forms a general "C" configurations, said first and second directions of magnetization differing by between about 5 and 90 degrees. Additionally, said first area should occupy between about 10 and 95% of the area occupied by said second area. It should also be noted that either or both areas may be made up of more than one non-contiguous sub-areas.

What is claimed is:

1. A method to increase an operating margin of a magnetic random access memory, having a wide programming range, comprising:

providing a magnetically pinned layer, a magnetically free layer, and a transition layer between said magnetically pinned layer and said magnetically free layer;

patterning said magnetically free layer into a memory element shape that includes a first area, whose magnetization is along said magnetically pinned layer in a first magnetization direction, and a second area comprising two opposing tip regions having a second magnetization direction that is at an angle relative to said first magnetization direction, said second magnetization direction having a component that is perpendicular to said first magnetization direction with said first magnetization direction and said second magnetization direction differing by between about 5 and 90 degrees, and with said first area occupying between about 10 and 95% of an area occupied by said second area;

providing a circuit architecture that organizes write word lines and bit lines into a plurality of segmented write line groups, each of said segmented write line groups including a plurality of memory cells operatively coupled to a corresponding segmented write word line conductor, memory cells a segmented write word line being simultaneously programmed by a plurality of bit lines operatively coupled to said memory cells for selectively writing information into the memory cells; and thereby, in combination with said shaped memory elements, widening said programming range by enabling said magnetic random access memory to operate in a region where any MRAM cell programming variation is reduced and where there is a reduced possibility of any of said memory cells being subjected to a half-select error.

2. The method of claim 1 wherein said memory element has a shape that is selected from the group consisting of shapes alpha, beta, gamma, delta, concave hexagon, epsilon, zeta, eta, theta, iota, kappa, lambda, crescent, sausage, and boomerang.

3. The magnetic random access memory of claim 2 wherein said alpha shape further comprises three sides of a rectangle concavely connected by a symmetrical curve.

4. The method of claim 2 wherein said beta shape further comprises three sides of a rectangle that are concavely connected through an asymmetrical curve.

5. The method of claim 2 wherein said gamma shape further comprises a straight line side, an opposing concave side, symmetrically disposed relative to said straight line side, and a pair of opposing convex sides that connect said opposing concave side to said straight line side.

6. The method of claim 2 wherein said delta shape further comprises a straight line side, an opposing concave side, asymmetrically disposed relative to said straight line side, and a pair of opposing convex sides that connect said opposing concave side to said straight line side.

7. The method of claim 2 wherein said concave hexagon further comprises three sides of a rectangle that are concavely connected through three straight lines of approximately equal length.

8. The method of claim 2 wherein said epsilon shape further comprises a pair of opposing parallel lines, having corresponding first and second ends, said first ends being connected through a convex curve and said second ends being connected through a concave curve having a radius that is the same as that of said convex curve.

9. The method of claim 2 wherein said zeta shape further comprises a pair of opposing parallel lines, having corresponding first and second ends, said first ends being connected through a convex curve and said second ends being connected through a concave curve that has radius of curvature greater than that of said convex curve.

10. The method of claim 2 wherein said eta shape further comprises a pair of opposing parallel lines, having corresponding first and second ends, said first ends being connected through a convex curve and said second ends being connected through a concave curve whose radius of curvature is less than that of said convex curve.

11. The method of claim 2 wherein said theta shape further comprises a pair of symmetrically disposed concentric arcs that subtend less than 180 degrees, said symmetrically disposed concentric arcs being connected to one another, at corresponding ends, by straight lines.

12. The method of claim 2 wherein said iota shape further comprises a pair of symmetrically disposed concentric arcs that subtend more than 180 degrees, said symmetrically disposed concentric arcs being connected to one another, at corresponding ends, by straight lines.

13. The method of claim 2 wherein said kappa shape further comprises a pair of symmetrically disposed concentric arcs that subtend less than 180 degrees, said symmetrically disposed concentric arcs being connected to one another at corresponding ends by a straight line that is also a base of a triangular shape having a rounded apex.

14. The method of claim 2 wherein said lambda shape further comprises a pair of symmetrically disposed concentric arcs that subtend more than 180 degrees, said symmetrically disposed concentric arcs being connected to one another at corresponding ends by a straight line that is also a base of a triangular shape having a rounded apex.

15. A magnetic random access memory (MRAM), having a wide programming range and a circuit architecture, comprising:

a magnetically pinned layer, a magnetically free layer, and a transition layer between said magnetically pinned layer and said magnetically free layer;

said magnetically free layer having a shape that includes a first area that has a first magnetization direction along said magnetically pinned layer's magnetization direction and a second area comprising two opposing tip regions having second magnetization directions that are at an angle relative to said first magnetization direction, said second magnetization directions including a component that is perpendicular to said first magnetization direction, said first magnetization direction and said second magnetization direction differing by between about 5 and 90 degrees, and said first area occupying between about 10 and 95% of an area occupied by said second area;

said circuit architecture being organized so that write word lines and bit lines form a plurality of segmented write line groups, each of said segmented write line groups including a plurality of memory cells operatively coupled to a corresponding segmented write word line conductor, and all memory cells that are on identical segmented write word lines having been programmed simultaneously by a plurality of bit lines operatively coupled to said memory cells for selectively writing states into said memory cells; and whereby, by virtue of having shaped memory elements, together with an ability to operate in a region where there is less variation in MRAM cell programming as well as a reduced possibility of half-select errors by any of said memory cells, said wide programming range exists.

16. The magnetic random access memory of claim 15 wherein said memory element shape is selected from the group consisting of shapes alpha, beta, gamma, delta, concave hexagon, epsilon, zeta, eta, theta, iota, kappa, lambda, crescent, sausage, and boomerang.

17. The magnetic random access memory of claim 16 wherein said alpha shape further comprises three sides of a rectangle concavely connected by a symmetrical curve.

18. The magnetic random access memory of claim 16 wherein said beta shape further comprises three sides of a rectangle that are concavely connected through an asymmetrical curve.

19. The magnetic random access memory of claim 16 wherein said gamma shape further comprises a straight line side, an opposing concave side, symmetrically disposed relative to said straight line, and a pair of opposing convex sides that connect said concave side to said straight line side.

20. The magnetic random access memory of claim 16 wherein said delta shape further comprises a straight line side, an opposing concave side, asymmetrically disposed relative to said straight line, and a pair of opposing convex sides that connect said concave side to said straight line side.

21. The magnetic random access memory of claim 16 wherein said concave hexagon further comprises three sides of a rectangle that are concavely connected through three straight lines of approximately equal length.

22. The magnetic random access memory of claim 16 wherein said epsilon shape further comprises a pair of opposing parallel lines, having corresponding first and second ends, said first ends being connected through a convex curve and said second ends being connected through a concave curve having a radius that is the same as that of said convex curve.

23. The magnetic random access memory of claim 16 wherein said zeta shape further comprises a pair of opposing parallel lines, having corresponding first and second ends, said first ends being connected through a convex curve and said second ends being connected through a concave curve that has radius of curvature greater than that of said convex curve.

24. The magnetic random access memory of claim 16 wherein said eta shape further comprises a pair of opposing parallel lines, having corresponding first and second ends, said first ends being connected through a convex curve and said second ends being connected through a concave curve whose radius of curvature is less than that of said convex curve.

25. The magnetic random access memory of claim 16 wherein said theta shape further comprises a pair of symmetrically disposed concentric arcs that subtend less than 180 degrees, said symmetrically disposed concentric arcs being connected to one another, at corresponding ends, by straight lines.

26. The magnetic random access memory of claim 16 wherein said iota shape further comprises a pair of symmetrically disposed concentric arcs that subtend more than 180 degrees, said symmetrically disposed concentric arcs being connected to one another, at corresponding ends, by straight lines.

27. The magnetic random access memory of claim 16 wherein said kappa shape further comprises a pair of symmetrically disposed concentric arcs that subtend less than 180 degrees, said symmetrically disposed concentric arcs being connected to one another at corresponding ends by a straight line that is also a base of a triangular shape having a rounded apex.

28. The magnetic random access memory of claim 16 wherein said lambda shape further comprises a pair of symmetrically disposed concentric arcs that subtend more than 180 degrees, said symmetrically disposed concentric arcs being connected to one another at corresponding ends by a straight line that is also a base of a triangular shape having a rounded apex.

* * * * *